(12) United States Patent
Sindalovsky et al.

(10) Patent No.: US 6,525,681 B2
(45) Date of Patent: Feb. 25, 2003

(54) DC COMPENSATION METHOD AND APPARATUS

(75) Inventors: Vladimir Sindalovsky, Perkasie, PA (US); Donald Raymond Laturell, Allentown, PA (US)

(73) Assignee: Agere Systems, Inc., Berkeley Heights, NJ (US)

( * ) Notice: Subject to any disclaimer, the term of this patent is extended or adjusted under 35 U.S.C. 154(b) by 0 days.

(21) Appl. No.: 09/820,475

(22) Filed: Mar. 29, 2001

(65) Prior Publication Data

US 2002/0140587 A1 Oct. 3, 2002

(51) Int. Cl.[7] .............................................. H03M 1/10
(52) U.S. Cl. ........................................ 341/118; 341/120
(58) Field of Search ............................... 341/118, 120, 341/144, 126

(56) References Cited

U.S. PATENT DOCUMENTS 5,731,772 A * 3/1998 Mikkola et al. ............ 341/118
5,818,370 A * 10/1998 Sooch et al. ................ 341/120
6,229,466 B1 * 5/2001 Gattani ....................... 341/120

* cited by examiner

*Primary Examiner*—Howard L. Williams
(74) *Attorney, Agent, or Firm*—Synnestvedt & Lechner LLP

(57) ABSTRACT

A method and apparatus which compensates for the effect of DC components due to imperfections in analog circuits used in a coder/decoder (CODEC) by adding a compensation value to an outgoing signal prior to the DC components being introduced. The method includes the steps of determining a compensation value to compensate for the effect of the DC components due to imperfections in analog circuits in a CODEC and adding the compensation value to a path within the CODEC. The apparatus includes an adder coupled in at least one outgoing path of the CODEC, the adder having an input for coupling to a DSP, wherein the DSP determines a DC compensation value to compensate for the effect of the DC components and the adder adds the DC compensation value to the outgoing path.

20 Claims, 4 Drawing Sheets

US 6,525,681 B2

DC COMPENSATION METHOD AND APPARATUS

FIELD OF THE INVENTION

The present invention relates to telecommunication systems and, more particularly, to a DC compensation method and apparatus.

BACKGROUND OF THE INVENTION

In many modem telecommunication systems, e.g., Digital Subscriber Line (DSL) systems, a digital signal processor (DSP) at a user site processes data for transmission to and received from a telephone company central office (TCCO). The data is exchanged between the DSP and the TCCO via a transmission line.

As depicted in FIG. 1, a coder/decoder (CODEC) 10 is positioned between the DSP 20 and the TCCO 30 to convert digital signals from the DSP 20 to analog for transmission to the TCCO 30 over a transmission line 40, and to convert analog signals received from the TCCO 30 over the same transmission line 40 to digital for processing by the DSP 20. The CODEC 10 contains analog circuits which may contribute DC components to signals within the telecommunication system. If not compensated for, these DC components may result in a DC offset on a receive path after analog-to-digital conversion, signals falling outside of the dynamic range of circuits within the CODEC 10, signal degradation, and digital representation errors. Accordingly, methods and apparatuses for compensating for these DC component are useful.

FIG. 2 depicts a typical prior art telecommunication apparatus residing at a user site. The apparatus comprises a DSP 20 for processing digital signals, a CODEC 10 for converting signals between the digital and analog domains, and a known hybrid circuit 25 for converting between unidirectional data flow and bidirectional data flow. In addition, the apparatus comprises capacitors 62, 64, 72, and 74 for filtering out DC components introduced by transmit path and echo cancellation path components within the CODEC 10 and capacitors 42 and 44 for preventing DC components from flowing between the telecommunication apparatus of FIG. 2 and the transmission line 40. Also, capacitors 82, 84 are coupled within the CODEC 10 to remove other DC components found in the receive path within the CODEC 10.

The DSP 20 processes data for transmission over a transmission line 40 (FIG. 1) to a remote processing facility, e.g., a TCCO 30, and processes data received over the same transmission line 40 from the TCCO 30. Also, the DSP 20 typically generates an echo cancellation signal which represents a delayed and specially filtered transmit signal to cancel remote echos on the transmission line 40. For example, the echo cancellation signal cancels echos due to bridge taps and other types of connections on the transmission line 40.

The hybrid circuit 25 is a well known circuit for converting between unidirectional data flowing through the CODEC 10 and bidirectional data flowing on the transmission line 40. The hybrid circuit 25 contains circuitry to prevent transmit signals from interfering with receive signals.

The CODEC 10 comprises circuitry necessary to couple the DSP 20 to a transmission line 40 (FIG. 1). The circuitry comprises an interface 50, an optional amplifier (op-amp) 80, a receive amplifier (RXAmp)/analog filter 85, a digital-to-analog (D/A) converter 60, a D/A converter 70, and an analog-to-digital (A/D) converter 90. In addition, the CODEC 10 comprises capacitors 82, 84 for removing DC components introduced in the receive path of the CODEC 10.

The interface 50 within the CODEC 10 organizes signals to and from the DSP 20 into a transmit path, an echo cancellation path, and a receive path. The RXAmp/analog filter 85 in the receive path amplifies a receive signal from the transmission line to remedy attenuation of the receive signal as it is passed over the transmission line 40, and filters out frequencies which may cause aliasing (i.e., the interpretation of high frequencies as lower frequencies).

The op-amp 80, together with the hybrid circuit 25, reduces the effect of the AC components of the transmit signal and an echo signal on the receive path. Since the receive signal passes over the same transmission line 40 (FIG. 1) as the transmit signal and the echo signal, the receive signal will include images of the transmit signal and the echo signal. If the transmit signal and the echo cancellation signal of the CODEC 10 are applied directly to the input of the op-amp 80 at 180 degrees out of phase with the images of the transmit signal and the echo signal in the receive signal (in this case through the hybrid circuit 25), the effect of the transmit signal and echo signal on the receive signal in the receive path is reduced greatly. The residual signal at the output of the op-amp 80 will contain mostly receive signal.

The CODEC 10, through the use of the D/A converter 60, converts digital signals from the DSP 20 to analog signals for transmission over a transmission line 40 (FIG. 1). Optionally, the CODEC 10 contains another D/A converter 70 for converting echo cancellation signals developed by the DSP 20 from digital-to-analog. In addition, the A/D converter 90 converts analog signals received from the TCCO 30 (FIG. 1) via the transmission line 40 (FIG. 1) to digital signals for processing by the DSP 20.

Due to inherent imperfections of analog circuits, DC components are introduced within the CODEC 10 which contribute to a DC offset after conversion by A/D converter 90. The DC components introduced by the analog circuits within the CODEC alter the voltage level around which the resultant signals are centered. For example, if an analog signal varies between a voltage level of −1 V and +1 V for a 0 V DC component, the analog signal would vary between 0V and 2 V for a +1 V DC component, potentially resulting in saturation of the circuit to which this signal is applied. If circuits which are coupled to the analog signals are designed such that their dynamic range is between −1 V and +1 V, the dynamic range of the circuit is effectively reduced and may result in digital representation errors. Digital representation errors may occur when a signal with a DC component is converted by an A/D converter such as A/D converter 90 without correcting for the DC component.

The DC components may also result in signal degradation. Signal degradation occurs when analog circuits such as op-amp 80 and RXAmp/analog filter 85 amplify the DC component by a DC gain and introduce their own DC components. Unless neutralized, these DC components will degrade the quality of the receive signal.

Additional components (not shown) within the CODEC provide additional signal processing. An example of a CODEC 10 is found in the data sheets for the 3.3 V Integrated ADSL Over Pots CODEC produced by Texas Instruments, Inc. (part no. TLV320AD11A), incorporate fully herein by reference.

In prior art systems, such as the one depicted in FIG. 2, the DC components are removed through the use of AC coupling capacitors 62, 64, 72, 74, 82, 84 which filter out DC components introduced by analog circuits. Hence, the DC components will not affect the receive signal. Eliminating typical DC components in the transmit path and the receive path, however, requires large AC coupling capacitors 62, 64, 72, 74. The AC coupling capacitors 62, 64, 72, 74 need to be large enough to avoid introducing a noticeable impedance at the frequencies of interest, e.g., typically 25 kHz or higher for an asynchronous digital subscriber line (ADSL). Presently, electrolytic capacitors in the microfarad range are used to remove the DC offset in the transmit and receive paths. In addition, electrolytic capacitors may be used to remove DC components in the receive path.

The electrolytic capacitors which are presently used, however, introduce a non-desirable, non-linear distortion to the system and are too large to be fabricated on a chip. Since the capacitors are too large to be fabricated on a chip, additional printed circuit board (PCB) surface area is required to house external capacitors. In addition, additional pins on the CODEC 10 are required to connect the external capacitors to the CODEC 10, thereby increasing the pin count of the CODEC 10. The increased pin count necessitates a larger chip which further requires additional PCB surface area. The requirement for additional PCB surface area is undesirable since PCB surface area is typically at a premium.

Accordingly, since removing the effect of DC components is necessary, non-linear distortion is non-desirable, and PCB surface area is valuable, there has been a long felt need in the field of the invention for a superior method and apparatus to remove the effect of DC components in a CODEC. The present invention satisfies this need among others.

SUMMARY OF THE INVENTION

The present invention provides for a method and apparatus which overcomes the aforementioned problems of removing the effect of DC components due to analog circuits within a coder/decoder (CODEC) by adding a compensation value to an outgoing signal. This arrangement neutralizes the effect of the DC components, thereby removing the need for external AC coupling capacitors. Removing the AC coupling capacitors removes non-linear distortion associated with these components and reduces printed circuit board (PCB) surface area requirements. The PCB surface area requirements are reduced due to the elimination of the PCB surface area reserved for the external AC coupling capacitors and the smaller CODECs which can be produced due to reduced pin requirements.

One aspect of the present invention is a method of compensating for the effect of DC components due to imperfections in analog circuits employed in a CODEC. The method comprises determining a compensation value and adding the compensation value to a path within the CODEC. In a preferred embodiment, the compensation value corresponds to the amount of DC compensation necessary to remove a DC offset. Preferably, the DC offset reported by the A/D conversion process is used to determine the amount of DC compensation necessary to remove the DC offset from a receive path within the CODEC.

Another aspect of the invention is an apparatus to compensate for the effect of DC components due to analog circuits employed in a CODEC. The apparatus comprises an adder coupled in at least one outgoing path of the CODEC, the adder having an input for coupling to a DSP, wherein the DSP determines a DC compensation value to compensate for the effect of DC components and the adder adds the DC compensation value to the outgoing path. Preferably, the DC compensation value is based on a DC offset.

DETAILED DESCRIPTION OF THE INVENTION

The present invention relates to a method and apparatus capable of compensating for the effect of DC components due to analog circuits within a telecommunication device. The present invention finds particular utility in compensating for the effect of DC components introduced by imperfections in analog circuits used in a coder/decoder (CODEC). In a preferred embodiment, a DC offset is used to determine a DC compensation value to compensate for the effect of the DC components. The DC offset is a DC component which is present in a receive path of the CODEC after analog-to-digital conversion. By removing the DC offset, the effect of the DC components can be effectively neutralized.

Figure 3:
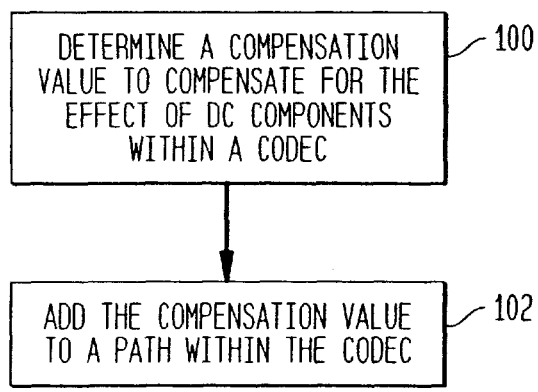
FIG. 3 is a flow chart of a method of compensating for the effect of DC components in accordance with the present invention.

FIG. 3 sets forth preferred steps for compensating for the effect of DC components in a CODEC. In step 100, a DC compensation value to compensate for the effect of DC components introduced in a CODEC is determined. In a preferred embodiment, the DC compensation value of step 100 is determined by a digital signal processor (DSP) based on a DC offset in the CODEC.

In step 102, the determined DC compensation value is added to an outgoing path within the CODEC to neutralize the effect of DC components due to analog circuits within the CODEC before they are introduced. In a preferred embodiment, the determined DC compensation value is added to a transmit path of the CODEC by a DSP through an adder. In an alternative embodiment, the determined DC compensation value is added to an echo cancellation path of the CODEC. Preferably, the determined DC compensation value is added prior to digital-to-analog conversion in the CODEC.

Figure 4:
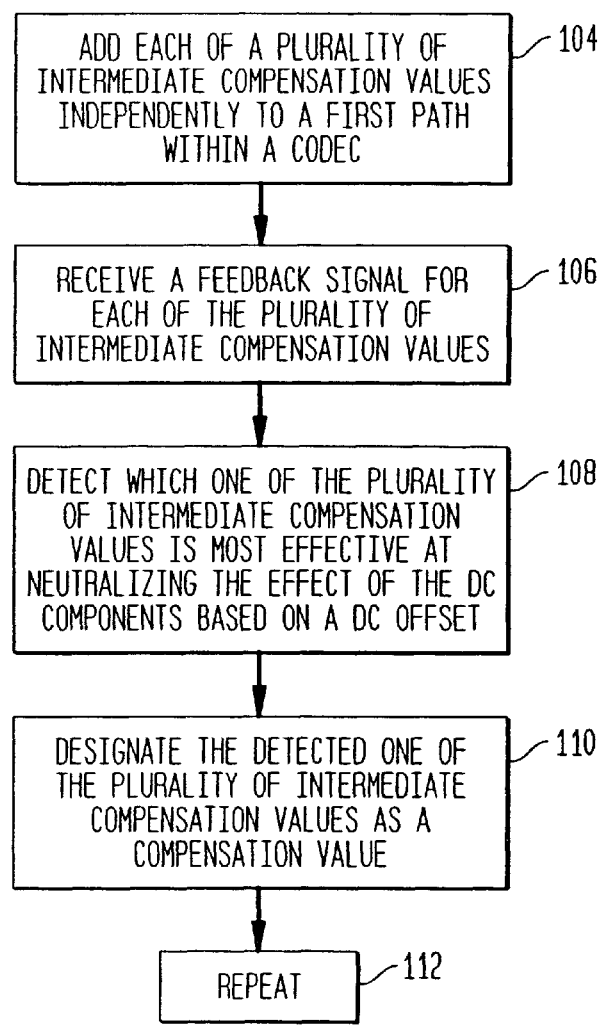
FIG. 4 is a flow chart of a method for determining a DC compensation value in accordance with the present invention.

FIG. 4 sets forth the steps of a preferred method for determining the DC compensation value of step 100 (FIG. 3). In step 104, each of a plurality of intermediate DC compensation values are added to a path within a CODEC. Preferably, the intermediate DC compensation values are added independently in a sequential order. In the preferred embodiment, the intermediate DC compensation values are added to a transmit path of the CODEC by a DSP coupled to the CODEC through an adder until an effective DC compensation value is determined. Each of the intermediate DC compensation values are added for a predetermined period of time. In an alternative embodiment, the intermediate DC compensation values are added to an echo cancellation path of the CODEC.

In step 106, a feedback signal is received for each of the plurality of intermediate DC compensation values of step 104. In the preferred embodiment, the feedback signal is received at a digital signal processor (DSP) over a receive path of the CODEC. The feedback signal corresponds to the intermediate DC compensation values being added to the path within the CODEC.

In step 108, the DC compensation value of step 100 (FIG. 3) which is effective at neutralizing the effect of the DC components is detected. In the preferred embodiment, a digital signal processor (DSP) detects the effective DC compensation value through the use of the feedback signal developed in step 106.

The effective DC compensation value is determined in the preferred embodiment by monitoring a receive signal received over a receive path of the CODEC during periods of time corresponding to the addition of a DC compensation values to the path within the CODEC for each intermediate DC compensation value until an effective DC compensation value is determined. Over time, the average DC value of the receive signal will settle to a value corresponding to the DC offset. In the preferred embodiment, the DSP monitors the average DC value of the receive signal for a predetermined period of time and determines the DC compensation value which results in a minimum average DC offset for the receive signal. Preferably, the predetermined period of time is greater than or equal to the amount of time for the receive signal to settle to the DC offset on the receive path. Various alternative methods for determining an effective DC compensation value will be readily apparent to those skilled in the art.

In step 110, the DC compensation value which is effective at neutralizing the effect of the DC components is designated as the DC compensation value for addition to a path within the CODEC in step 102 (FIG. 3). In the preferred embodiment, the DC compensation value is the intermediate DC compensation value which results in the minimum average DC value of the receive signal for the DC offset.

In step 112, the steps for determining the compensation value of step 100 (FIG. 3) are repeated. The steps are repeated to account for variation in the DC components and, hence, the DC offset, due to temperature changes and other environmental conditions to which analog components within the CODEC are exposed.

Figure 1:
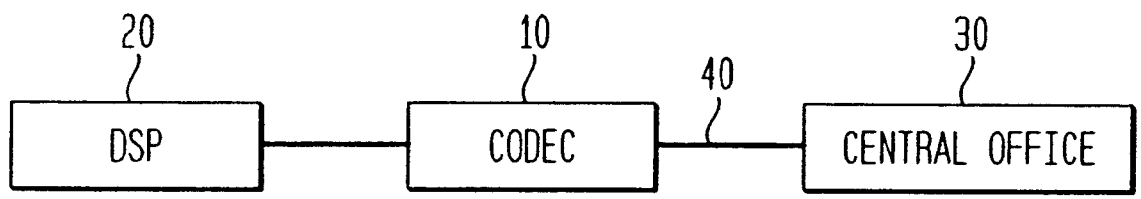
FIG. 1 is a block diagram of a prior art telecommunication system.
Figure 2:
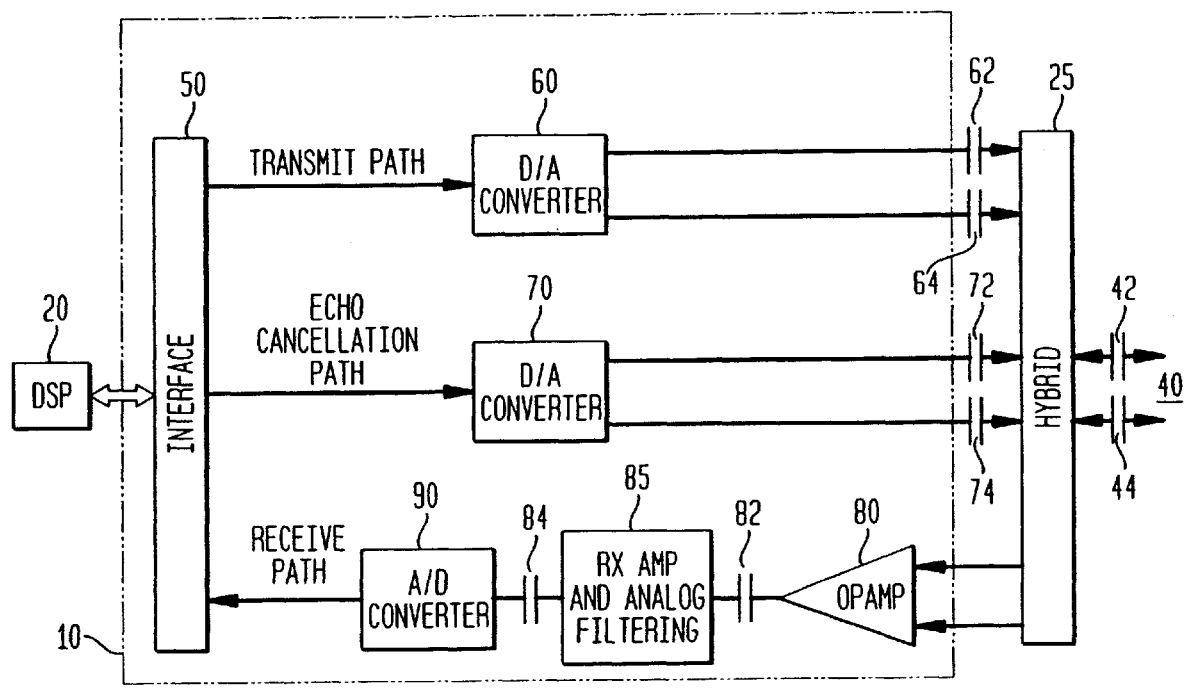
FIG. 2 is a block diagram of a prior art user side signal processing apparatus capable of filtering out DC components.
Figure 5:
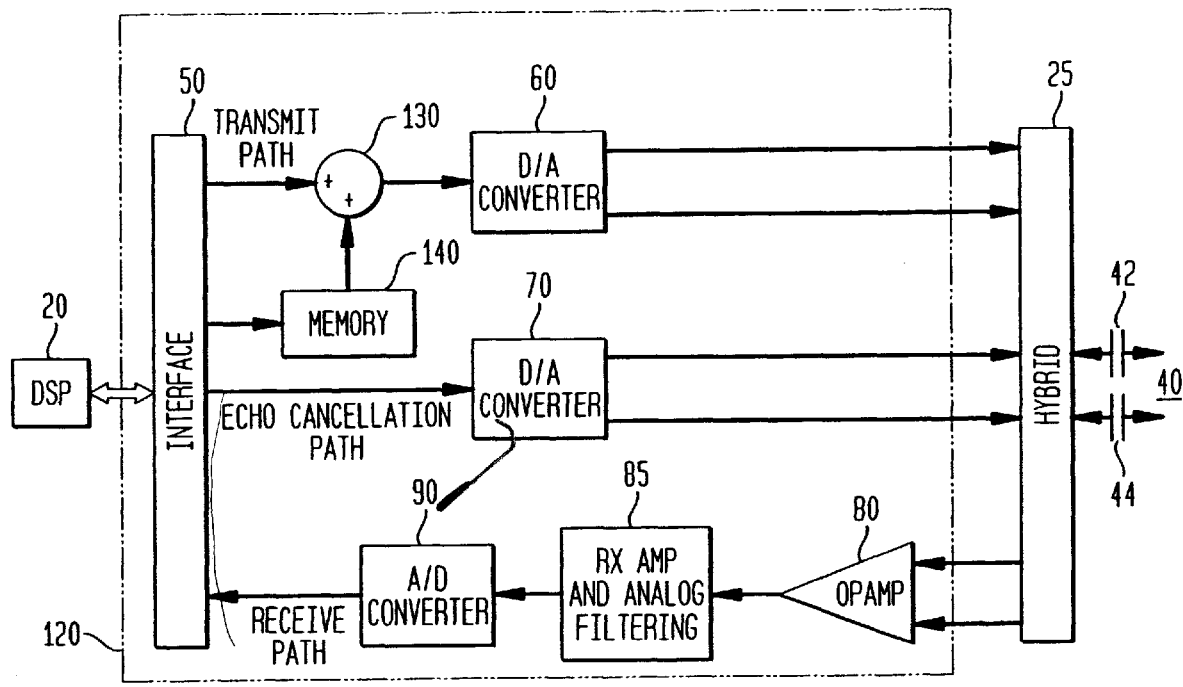
FIG. 5 is a block diagram of a user side signal processing apparatus capable of compensating for the effect of DC components in accordance with the present invention.

FIG. 5 depicts a preferred apparatus for performing the steps set forth in FIGS. 3 and 4. The apparatus includes a DSP 20, a CODEC 120 and a hybrid circuit 25. The apparatus produces a transmit (TX) signal for transmission over a transmission line 40 (FIG. 1) and processes a receive (RX) signal received over the same transmission line 40. The apparatus depicted in FIG. 5 is essentially the same as the apparatus depicted in FIG. 2 except for the addition of a new CODEC 120 (comprising an adder 130 and a memory 140) and the elimination of the AC coupling capacitors 62, 64, 72, 74, 82, 84 (FIG. 2). Accordingly, the DSP 20 and the hybrid circuit 25 will be discussed generally, and the CODEC 120 will be described in greater detail.

The DSP 20 is a digital processor of conventional design for processing digital signals. In the preferred embodiment, among other functions, the DSP 20 generates a transmit path signal and, optionally, an echo cancellation path signal, and processes a receive path signal. Also, in the preferred embodiment, the DSP 20 determines the DC compensation value of step 100 (FIG. 3). In an alternative embodiment, the DC compensation value is determined by an application specific DSP which may reside in the CODEC 120. A suitable DSP 20 and instructions for performance by the DSP 20 to determine the DC compensation value will be readily apparent to those skilled in the art.

The hybrid circuit 25 is a well known circuit for converting between unidirectional data flowing through the CODEC 10 and bidirectional data flowing on the transmission line 40. The hybrid circuit 25 contains circuitry to prevent transmit signals from interfering with receive signals. Hybrid circuits such as hybrid circuit 25 are well known in the art.

The CODEC 120 contains circuitry needed to couple the DSP 20 to a transmission line 40. In the preferred embodiment, the CODEC 120 includes an interface 50, a transmit path digital-to-analog (D/A) converter 60, a echo cancellation path D/A converter 70, a receive path analog-to-digital (A/D) converter 90, an op-amp 80, a receive path amplifier (RXamp)/analog filter 85, an adder 130, and a memory element 140. In addition, the CODEC 120 contains additional circuitry for performing other function such as filtering the transmit signal and the echo cancellation signal. In the preferred embodiment, signals passed over the transmission line are passed in the analog domain. Since the DSP 20 processes signals in the digital domain, the signals must be converted between the analog and the digital domains. The CODEC 120 performs this function, among others.

The interface 150 organizes signals within the CODEC 120. In the preferred embodiment, the interface 150 organizes transmission signals to and from the DSP 20 over a transmit path, an echo cancellation path, and a receive path. In addition, in the preferred embodiment, the interface 150 is used to route the DC compensation value determined by the DSP 20 to the memory element 140. In an alternative embodiment, if an echo cancellation signal is not developed by the DSP 20, the interface 150 may not contain an echo cancellation path.

The op-amp 80 is a conventional op-amp which, together with the hybrid circuit 25, will cancel non-receive signal images (e.g., images of the transmit path signal) on the receive signal. In the preferred embodiment, the op-amp 80 is configured to cancel images of the transmit signal and, optionally, the echo signal on the receive path so that a "clean" receive signal (i.e., a receive signal without images of other signals) can be obtained. The configuration of the op-amp 80 and its connection within the system depicted in FIG. 5 will be readily apparent to those skilled in the art.

The RXAmp/analog filter 85 amplifies and filters signals. In the preferred embodiment, the RXAmp/analog filter 85 amplifies the receive signal in the receive path from the transmission line and filters out frequencies which may cause aliasing. Amplification of the receive signal is required due to the attenuation of the receive signal as it is passed over the transmission line 40 (FIG. 1). Filtering is required to remove noise on the receive signal and prevent high frequencies from being interpreted by the A/D converter 90 as receive signal frequencies.

In the preferred embodiment, the CODEC 120, through the use of a transmit path D/A converter 60, converts a digital signal from the DSP 20 to an analog signal for transmission over a transmission line 40 (FIG. 1). Optionally, the CODEC 120 contains another D/A converter 70 for converting the echo cancellation signal developed by the DSP 20 from digital-to-analog. In addition, the CODEC 120 contains an A/D converter 90 for converting analog signals from the transmission line 40 (FIG. 1) to digital signals for processing by the DSP 20.

Due to inherent imperfections of analog circuits, the A/D 90 converter and the D/A converters 60, 70 introduce DC components to the transmit signal, the echo cancellation signal and the receive signal. Additional DC components are developed in other analog circuits within the CODEC 120, such as op-amp 80 and RXAmp/analog filter 85. In addition, the DC components are amplified by the DC gain of these circuits. The DC components result in a DC offset at the output of the A/D converter 90.

Figure 6:
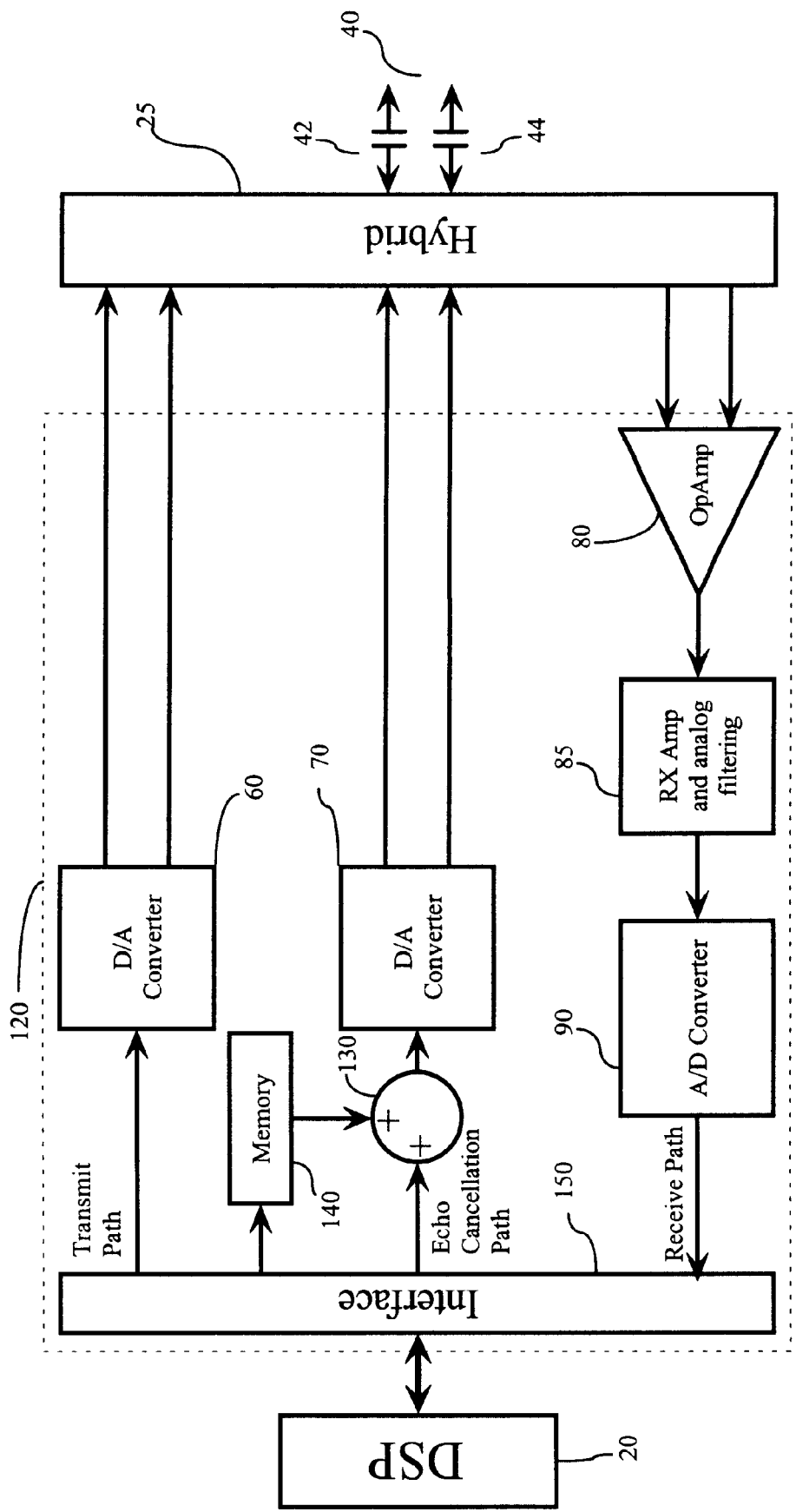
FIG. 6 is a block diagram of an alternative user side signal processing apparatus capable of compensation for the effect of DC components in accordance with the present invention.

In the preferred embodiment, the adder 130 adds the DC compensation value to a signal on an output path of the CODEC 120. In the preferred embodiment, the adder 130 is positioned within a transmit path of the CODEC 120 and is controlled by the DSP 20. In an alternative embodiment, as depicted in FIG. 6, the adder 130 is positioned within the echo cancellation path of the CODEC 120. Preferably, the adder 130 is a conventional adder capable of adding two sets of digital bits together.

The memory element 140 is a device capable of storing a value. In the preferred embodiment, the memory element 140 stores the DC compensation value determined by the DSP 20. By storing the DC compensation value in the memory element 140, the burden of providing the DC compensation value to the adder 140 is removed from the DSP 20 during periods when the DC compensation value is unchanged. Preferably, the memory element 140 is a conventional register or memory location in which the DC compensation value is stored and made available to the adder 130 until a new compensation value is determined by the DSP 20. In an alternative embodiment, the DSP 20 is coupled directly to the adder 130, thereby eliminating the need for the memory element 140.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. A method of compensating for the effect of DC components in a coder/decoder (CODEC) coupled to a hybrid circuit, said method comprising the steps of:
   determining a compensation value to compensate for the DC components added within the CODEC that are present in an incoming signal path; and
   adding said compensation value to an outgoing signal path within the CODEC, said compensation value introduced to said incoming signal path through the hybrid circuit to compensate for the DC components.

2. The method of claim 1, wherein said outgoing signal path is a transmit path carrying a data signal for transmission over a telecommunication line.

3. A method of compensating for the effect of DC components in a coder/decoder (CODEC), comprising the steps of:
   determining a compensation value to compensate for the DC components within the CODEC; and
   adding said compensation value to a first path within the CODEC, wherein said first path is an echo cancellation path carrying an echo cancellation signal for canceling echos on the transmission line.

4. The method of claim 1, wherein said adding step comprises adding said compensation value to said outgoing signal path in the digital domain prior to digital-to-analog conversion.

5. The method of claim 4, wherein said outgoing signal path is a transmit path carrying a data signal for transmission over a telecommunication line.

6. The method of claim 1, wherein said determining step comprises the steps of:
   adding each of a plurality of intermediate compensation values independently to said outgoing signal path within the CODEC;
   receiving a feedback signal for each of said plurality of intermediate compensation values, said feedback signal indicating the effectiveness of a corresponding one of said plurality of intermediate compensation values at removing a DC offset in the CODEC;
   detecting which one of said plurality of intermediate compensation values is effective at removing said DC offset; and
   designating said detected one of said plurality of intermediate compensation values as said compensation value.

7. The method of claim 6, further comprising the step of repeating said determining step.

8. The method of claim 6, wherein the CODEC is coupled between a digital signal processor (DSP) and a remote processor:
   said receiving step comprising receiving said feedback signal from said remote at said DSP through said receive path of the CODEC; and
   said detecting step comprising detecting said one of said plurality of intermediate compensation values which results in said CODEC converting said feedback signal from an analog signal to a digital signal with a minimum average DC value detected by said DSP.

9. The method of claim 6, wherein the CODEC is coupled to a digital signal processor (DSP):
   said receiving step comprising receiving said feedback signal originating from said DSP at said DSP through said receive path of the CODEC; and
   said detecting step comprising detecting said one of said plurality of intermediate compensation values which results in the CODEC converting said feedback signal from an analog signal to a digital signal with a minimum average DC value detected by said DSP.

10. A DC compensation apparatus to compensate for the effect of DC components due to imperfections in analog circuits used in a coder/decoder (CODEC) coupled to a hybrid circuit, the CODEC for converting signals on at least one outgoing path from a digital signal processor (DSP) from digital to analog and signals on an incoming path to said DSP from analog to digital, said DC compensation apparatus comprising:
   an adder coupled in one of the at least one outgoing paths of the CODEC, said adder having an input for coupling to the DSP, wherein the DSP determines a DC compensation value and said adder adds said DC compensation value to said one of the at least one outgoing paths, said DC compensation value introduced to the receive path through the hybrid circuit.

11. The apparatus of claim 10, wherein said one of the at least one outgoing paths is a transmit path.

12. The apparatus of claim 10, further comprising:
a memory element coupled between the DSP and said adder, wherein said memory element receives said DC compensation value from the DSP and stores said DC compensation value for access by said adder.

13. The apparatus of claim 10, further comprising a feedback path between the CODEC and the DSP.

14. The apparatus of claim 13 wherein said feedback path comprises the incoming path of the CODEC.

15. A coder/decoder (CODEC) having associated DC components configured for coupling between a digital signal processor (DSP) and a transmission line for converting signals between analog and digital, said CODEC coupled to said transmission line through a hybrid circuit, said CODEC comprising:
   an interface for coupling to the DSP, said interface receiving a digital transmit signal from the DSP and routing said digital transmit signal on a transmit path;
   an adder coupled in said transmit path for adding a DC compensation value to said digital transmit signal to compensate for the effect of the DC components within the CODEC;
   a digital-to-analog converter coupled in said transmit path for converting said digital transmit signal with said DC compensation value from digital to analog; and
   an analog-to-digital converter coupled in a receive path for converting an analog receive signal to a digital receive signal, said DC compensation value introduced to said receive path through the hybrid circuit, said DC compensation value compensating for the DC components such that said digital receive signal is free of DC offset.

16. The CODEC of claim 15, wherein the DSP determines said DC compensation value based on said DC offset.

17. The CODEC of claim 16, further comprising:
   a memory element coupled between the DSP and said adder, wherein said memory element receives said DC compensation value from the DSP and stores said DC compensation value for access by said adder.

18. The CODEC of claim 17, wherein said memory element is a register.

19. The CODEC of claim 17, wherein said memory element is a memory location.

20. The method of claim 1, wherein said outgoing signal path is an echo cancellation path carrying an echo cancellation signal for canceling echos on the transmission line.

* * * * *